United States Patent [19]

Stone

[11] Patent Number: 5,644,839

[45] Date of Patent: Jul. 8, 1997

[54] SURFACE MOUNTABLE SUBSTRATE EDGE TERMINAL

[75] Inventor: William M. Stone, Austin, Tex.

[73] Assignee: Xetel Corporation, Austin, Tex.

[21] Appl. No.: 476,400

[22] Filed: Jun. 7, 1995

Related U.S. Application Data

[63] Continuation-in-part of Ser. No. 257,864, Jun. 10, 1994, Pat. No. 5,509,197.

[51] Int. Cl.$^6$ ........................................... H01R 9/00
[52] U.S. Cl. ..................... 29/842; 29/876; 439/62; 439/636
[58] Field of Search ........................ 29/739, 832, 842, 29/876; 439/60, 62, 78, 79, 80, 82, 632, 636; 361/785

[56] References Cited

U.S. PATENT DOCUMENTS

| | | |
|---|---|---|
| 4,503,609 | 3/1985 | Mackay . |
| 4,606,594 | 8/1986 | Grabbe et al. . |
| 4,649,460 | 3/1987 | Marchisi et al. ............... 361/386 |
| 4,718,163 | 1/1988 | Berland et al. ............... 29/837 |
| 4,878,862 | 11/1989 | Wise . |
| 4,908,935 | 3/1990 | Blumenstock ............... 29/827 |
| 5,048,166 | 9/1991 | Wakamatsu ............... 29/830 |
| 5,239,748 | 8/1993 | Hamilton . |
| 5,307,929 | 5/1994 | Seidler ............... 206/331 |
| 5,320,541 | 6/1994 | Korsunsky et al. . |
| 5,334,046 | 8/1994 | Brouillette et al. ............... 439/540 |

FOREIGN PATENT DOCUMENTS

| | | |
|---|---|---|
| 0 237 728 A2 | 9/1987 | European Pat. Off. . |
| 2550894 | 2/1985 | France . |
| 5-343840 | 12/1993 | Japan . |
| 2 237 154 | 4/1991 | United Kingdom . |

OTHER PUBLICATIONS

IBM Tech Disclosure Bulletin vol. 26, No. 12 May 1984 p. 6479.

Arnold and Puttlitz, "Fabrication of Multilayer Ceramic Structure with External Leads," *IBM Technical Disclosure Bulletin*, 9(6):565–566, Nov. 1966.

Reid, "Low Impedance Laminar Bus Connector," *IBM Techical Disclosure Bulletin*, 12(12):2165, May,1970.

*Primary Examiner*—Carl J. Arbes
*Attorney, Agent, or Firm*—Arnold, White & Durkee

[57] ABSTRACT

A method is provided for attaching components to a substrate to form an edge connector thereon. In particular, the invention is useful for attaching an edge connector to a printed circuit board. The connector components are provided in a form that can be mounted on one side of a substrate, such as in a pick-and-place operation. The connector components may include pins for male connectors or sockets for female connectors. The pins or sockets of the connector are removably coupled to a carrier, forming a carrier assembly. The carrier assembly is configured to operably engage a carrier support that is integrally formed with the printed circuit board substrate. After the connector components are fastened, as by soldering, to the printed circuit board, the carrier and carrier support can be removed to leave the connector attached to the printed circuit board. A shroud may be installed over the connector pins to provide a shrouded connector.

18 Claims, 12 Drawing Sheets

SURFACE MOUNTABLE SUBSTRATE EDGE TERMINAL

BACKGROUND OF THE INVENTION

This application is a continuation-in-part of U.S. Ser. No. 08/257,864, filed Jun. 10, 1994, now U.S. Pat. No. 5,509,197, issued Apr. 23, 1996.

FIELD OF THE INVENTION

This invention relates to the manufacture of electronic printed circuit boards and the installation of edge connectors on such boards. In particular, a method and apparatus are provided for installing edge connectors on printed circuit boards as an integral part of the process of mounting electronic components on the printed circuit boards.

DISCUSSION OF THE RELATED ART

FIG. 1 illustrates a prior art printed circuit (PC) board edge connector installation. PC board 10 has an upper surface 22, a lower surface 24, a plurality of component pads 22 and a plurality of connector pads 12, 12a. The component pads 22 are for attachment, e.g. by soldering, of components 20 to the conductive components of the PC board. The connector pads are for attaching a connector to the conductive components of the PC board. A connector may provide male-type pins or female-type sockets for connection of the PC board to other PC boards or other devices. There are typically a plurality of connector pads aligned adjacent an edge of PC board 10, with one pad corresponding to each pin (or socket) of the connector. The connector pads may be located on one or both surfaces 22, 24 of PC board 10.

The prior art edge connector as shown (male-type) comprises pins 18, 18a inserted through insulating carrier 16. The tails (shown to the right) of pins 18, 18a are typically intended to be inserted into holes in another PC board and secured thereto, e.g. by soldering. The contact heads 14, 14a of pins 18, 18a protrude from insulating carrier 16 opposite the tails of the pins. Contact heads 14, 14a are configured and positioned to grasp or pinch the connector pads 12, 12a when the edge of PC board 10 is inserted into the gap between the contact heads 14, 14a of the connector. Contact heads 14, 14a of pins 18, 18a are typically soldered to the connector pads 12, 12a by any of several techniques that are well known in the art.

Installing an edge connector as shown in FIG. 1 requires an extra, time consuming, labor-intensive step in the process of manufacturing a complete PC board assembly that includes such an edge connector. All of the other components can be mounted on the PC board in an automated manner, such as by "pick-and-place" machines, and then soldered onto the board in a relatively continuous, well known manner. It was not heretofore possible to install edge connector components as an integral step in the same automated process used to mount the electronic components on a PC board. Because two separate steps were required, first installing the electronic components and then installing the connector, a manufacturer would often make a batch of boards before beginning the connector installation process. Because the boards often could not be tested until the connections were established, sometimes entire batches of defective boards were manufactured and not detected until the connector installation process was started. Even without defects, the process of installing the prior art edge connector added a relatively expensive step to the overall manufacturing process.

SUMMARY OF THE INVENTION

The problems outlined above are in large part solved by the method of the present invention. That is, the separate manufacturing step that was previously required to install an edge connector to an otherwise automatically manufactured printed circuit board is eliminated. The components making up the edge connector can be installed as an integral part of a pick-and-place operation and can be attached to the printed circuit board by soldering in the same manner as is used for other components, including surface mount components.

A method is provided for forming an edge connector on a substrate, such as a printed circuit board, that has connector pads positioned near an edge of the board where the connector is to be installed. The method includes placing the connector pins in a carrier, positioning the carrier such that the head ends of the connector pins are located adjacent the connector pads on the PC board, soldering the head ends of the connector pins to the connector pads, and removing the carrier so as to leave the connector pins properly positioned and securely fastened to the PC board. The connector pins may be in the form of individual pins which are inserted into holes in a carrier, or the pins may be permanently mounted in an insulating strip, as shown in FIG. 2. When the pins are mounted in an insulating strip, the carrier may either comprise an individual hole for each pin or it may comprise an elongated slot dimensioned to hold all of the pins.

In preferred embodiments of the invention, the printed circuit board is manufactured as part of a substrate assembly, which includes a carrier support as well as side rails to connect to the printed circuit board to the carrier support. Frangible joints may be provided between the side rails and the PC board and between the side rails and the carrier support. After the connector components are mounted in the carrier, the carrier is placed on the carrier support with the connector pins adjacent the corresponding connector pads on the printed circuit board. An aperture may be formed between the PC board, the carrier support and the side rails. In some configurations, the connector pins (or connector socket for female type connectors) and part of the carrier may be operatively positioned in the aperture, particularly where the connector is to reside in the same plane as the PC board. The carrier may be adhered or otherwise fastened to the carrier support if desired. After the connector pins are fastened to the connector pads, typically by soldering, the side rails my be broken off at the frangible joints, allowing the carrier to be removed, and leaving the connector installed on the printed circuit board.

In other embodiments of the invention, shrouded connectors may be provided by first mounting pins on a printed circuit board and then fitting a shroud, which is typically made of plastic, over the installed pins. This permits the pins to be installed on one or both sides of the board, and tested if desired, prior to installing the shroud over the pins. The shroud is typically installed by merely sliding it over the pins, and the shroud may be formed having structures that engage the pins and prevent its removal after it is installed.

The present invention therefore provides an improved process allows the components making up an edge connector to be installed on a printed circuit board as an integral part of a pick-and-place operation, and that eliminates a separate connector installation step from the manufacturing process. A shrouded connector may be formed and installed according to this invention by mounting connector pins on the printed circuit board and then fitting a shroud over the mounted pins. These and other advantages of the present invention will be further appreciated from the drawings and from the detailed description provided below.

BRIEF DESCRIPTION OF THE DRAWINGS

So that the manner in which the herein described advantages and features of the present invention, as well as others which will become apparent, are attained and can be understood in detail, more particular description of the invention summarized above may be had by reference to the embodiment thereof which is illustrated in the appended drawings, which drawings form a part of this specification.

It is to be noted, however, that the appended drawings illustrate only exemplary embodiments of the invention and are therefore not to be considered limiting of its scope, for the invention may admit to other equally effective embodiments.

FIG. 11 shows the carrier holding the pins and the substrate before they are joined.

FIG. 12 shows the embodiment of FIG. 11 after the carrier and pins have been attached to the substrate by glue.

FIG. 13 shows the substrate of FIG. 12 after it has been inverted. The carrier and pins to be attached to the opposite side of the substrate are also shown.

FIG. 14 shows the substrate including two printed circuit boards having connector pins and carriers mounted on both sides thereof prior to a soldering operation.

DETAILED DESCRIPTION OF THE PREFERRED EMBODIMENTS

Figure 1:
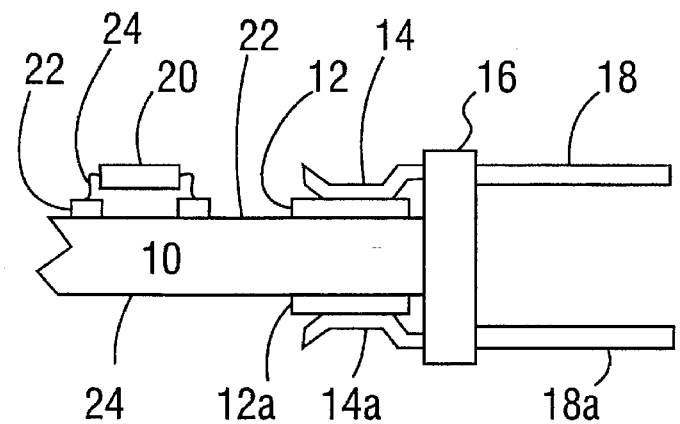
FIG. 1 shows a cross sectional view of an installed edge connector as was known in the prior art.
Figure 2:
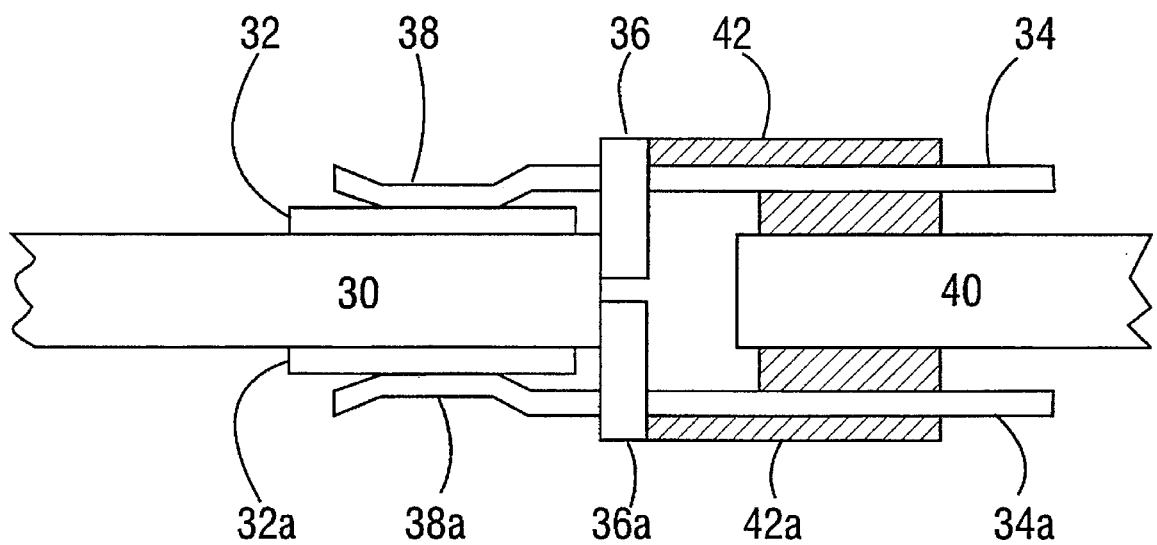
FIG. 2 shows a cross sectional view of an edge connector being installed according the present invention to provide connector pins on both sides of a printed circuit board, prior to removal of the carriers and the carrier support.
Figure 4:
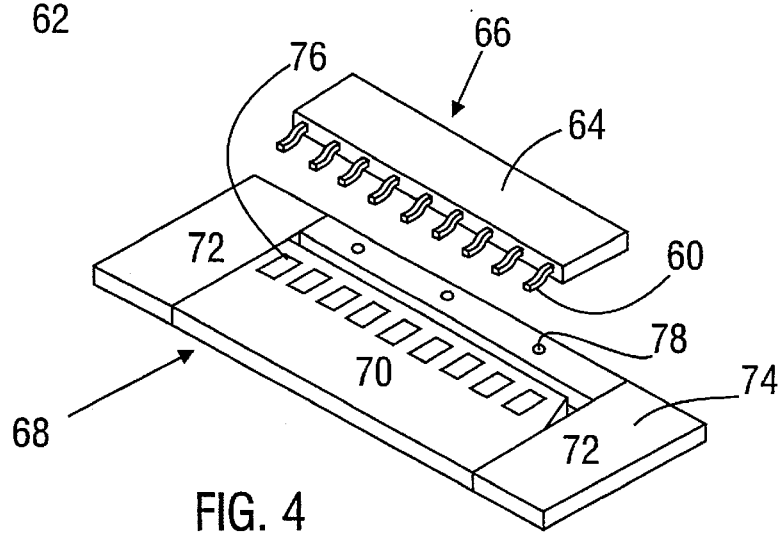
FIG. 4 shows a perspective view of a carrier and its relationship to a substrate to which the connector pins are to be attached.

FIG. 2 illustrates a preferred embodiment of the invention during the assembly process. An edge connector comprising a plurality of connector pins 34 and 34a is attached to an edge of PC board 30 by the present invention. PC board 30 and carrier support 40 are formed as part of a unitary structure that can be separated after all components are installed. FIG. 4 shows a PC board 70 integrally formed with carrier support 74 and side rails 72. After the manufacturing process is complete, side rails 72 may be broken off, thus separating the operative portion of PC board 70 from carrier support 74.

Referring again to FIG. 2, PC board 30 has a row of contact pads 32, 32a located proximate the edge where the edge connector is to be installed. Contact pads 32, 32a may be located on one side or on both sides of the PC board 30. Connector pins 34, 34a are inserted through insulators 36, 36a such that contact heads 38, 38a extend from one side of insulators 36, 36a. Carriers 42, 42a are used to hold the pin 34, 34a and insulator 36, 36a combinations during the installation process. To install upper pins 34, pins 34 are inserted into holes or a slot in carrier 42 that is dimensioned to slidable but closely receive pins 34. The combination of pins 34, insulator 36 and carrier 42 becomes a component that can be placed on the upper side of the PC board 30, which includes a carrier support 40 during the manufacturing process, during an automated, e.g. pick-and-place, manufacturing process.

In a preferred embodiment, carrier 42 is secured to the carrier support 40 with adhesive, which may be epoxy, during the installation process prior to soldering the contact heads 38 to the connector pads 32. The lower pins 34a are then installed in a similar fashion. Pins 34, 34a are slidable supported by carriers 42, 42a. After the pins 34 are soldered to PC board 30, carrier support 40 is separated from PC board 30. The carrier support 40 and carriers 42, 42a are removed, leaving the PC board 30 with edge connector pins 34, 34a properly positioned and attached to PC board 30. Note that by the use of this invention the PC board assembly is completed without requiring a separate, labor-intensive edge connector installation process.

Figure 15:
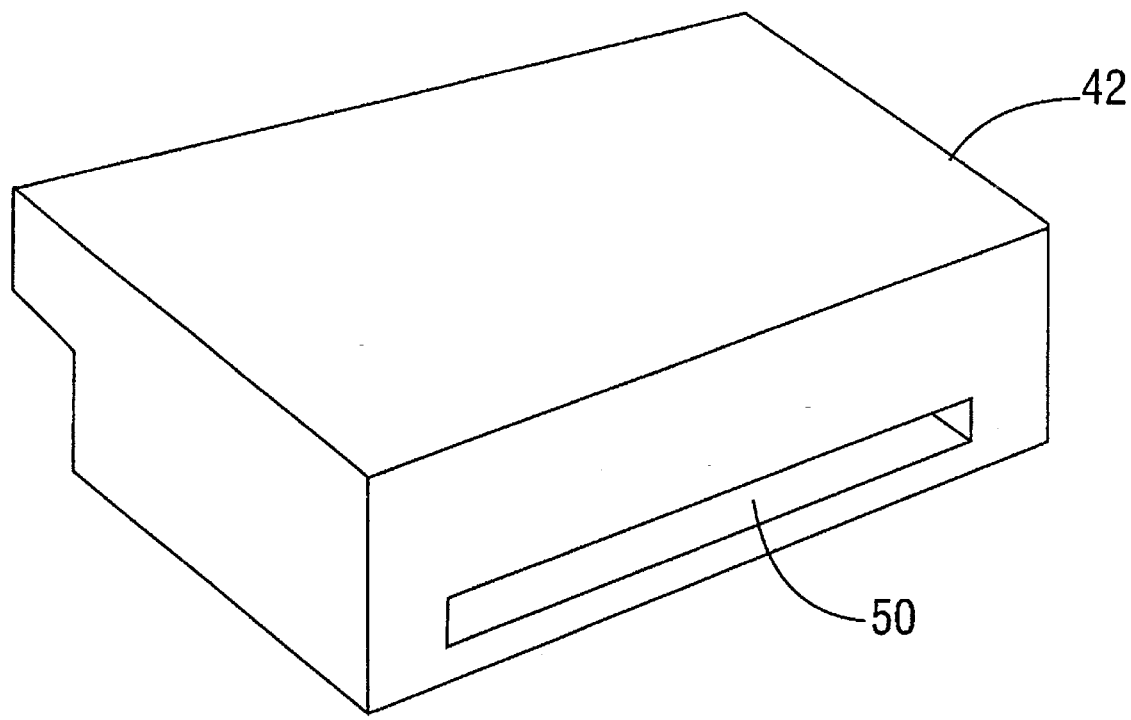
FIGS. 15–17 illustrate exemplary carrier structures that may be used with the present invention.
Figure 16:
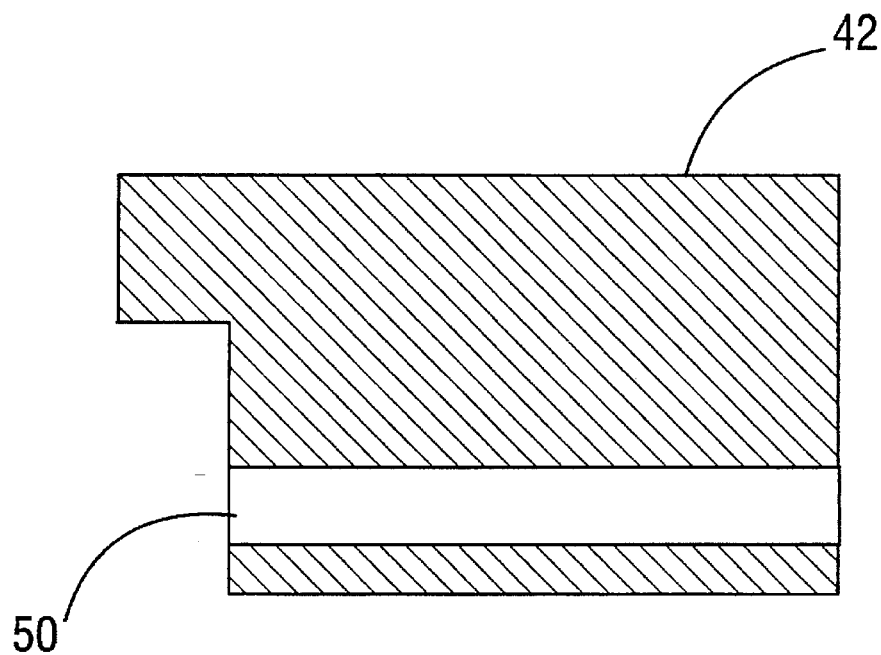
Figure 18:
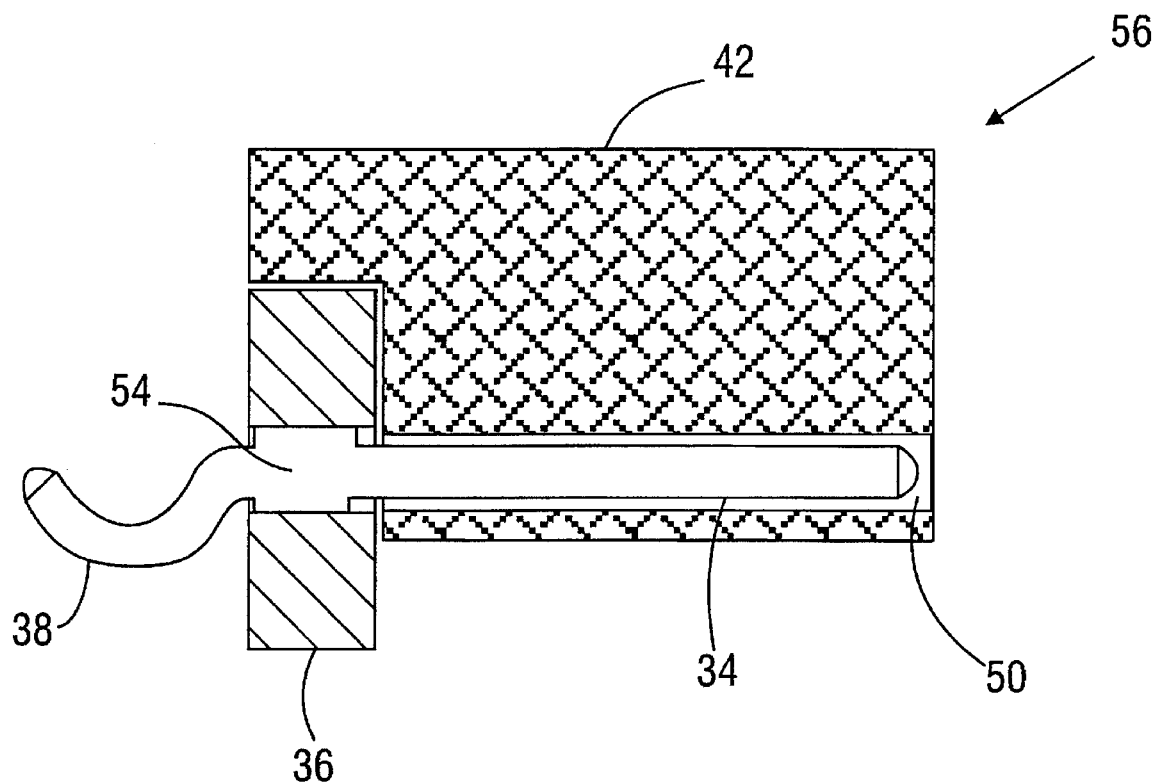
FIG. 18 is a cross sectional view of a carrier holding a set of connector pins mounted in an insulator.

A carrier suitable for use in the embodiment shown in FIG. 2 is illustrated in FIGS. 15, 16 and 18. Carrier 42 may be made from high temperature plastic, fiberglass, or the like. Carrier 42 has one or more cavities adapted to receive pins 34, which may be configured as a single slot shaped cavity 50, as shown in FIG. 15, or as a plurality of slots or holes, as shown in carrier 64 in FIG. 3. FIG. 16 shows a cross-sectional view of carrier 42, illustrating an embodiment in which cavity 50 extends all the way through carrier 42.

Insulator 36 is optional. Pins 34 may be supported individually by carrier 42 alone as is described in more detail below.

FIG. 18 shows a "pin carrier assembly", which may comprise pins 34, carrier 42, and insulator 36. Pin 34 (attached to insulator 36) is inserted into cavity 50 of carrier 42. This pin carrier assembly may be provided to a "pick-and-place" machine for automated installation onto a PC board. Each such assembly would typically comprise a linear array of a selected number of pins 34 to be attached to connector pads 32 on one side of a PC board. Note that the configuration of pin 34, insulator 36 and carrier 42 is somewhat different in FIG. 18 than in FIG. 2. The dimensions and the arrangement of these components are matters of design choice that will vary from one application to another. Note in FIG. 18 that pin 34 may include thickened or contoured section 54 to enable it to be mounted and held securely in insulator 36.

Figure 17:
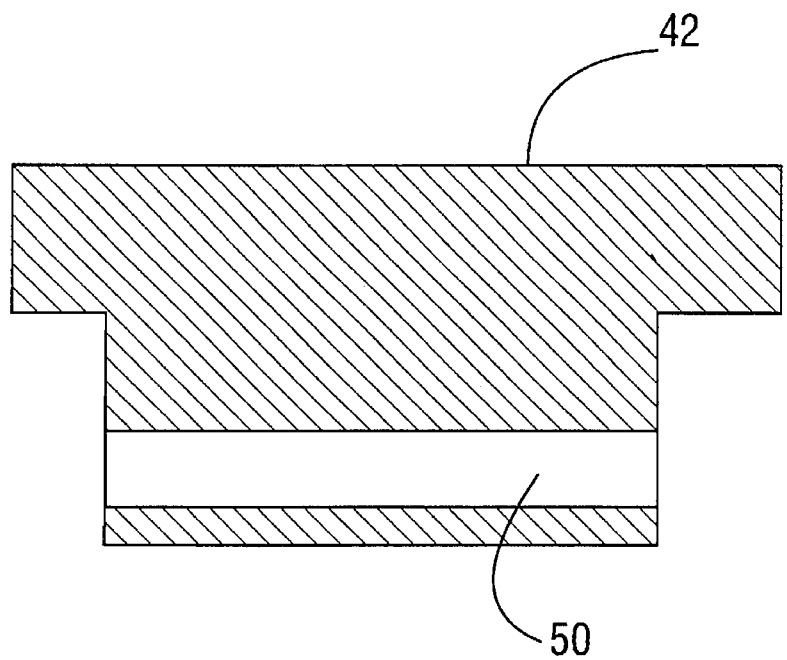

FIG. 17 illustrates a carrier that may be used to support pins extending from both sides. Such a carrier may be used to mount pins on two PC boards simultaneously, as is described below in connection with, for example, FIGS. 11–14.

Figure 3:
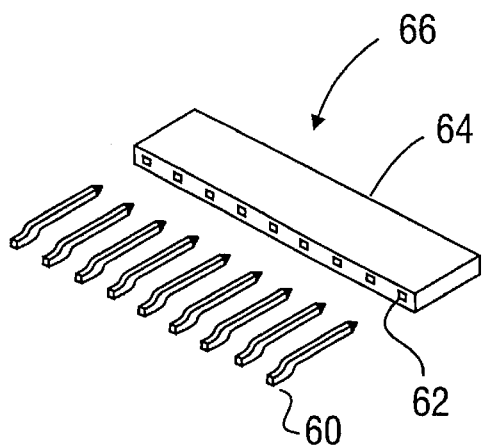
FIG. 3 shows an exploded view of a carrier assembly for use in manufacturing a male edge connector.

FIGS. 3–6 illustrate an embodiment of the present invention and a preferred method of attaching a set of edge connector pins to a PC board according to the present invention. Referring to FIG. 3, a plurality of connector pins 60 are inserted into pin cavities or holes 62 in carrier 64 to form pin carrier assembly 66. Now referring to FIG. 4, PC assembly 68 includes PC board 70, side rails 72, and carrier support 74. Connector pads 76 are positioned on PC board adjacent the edge where the edge connector is to be constructed. Each connector pad 76 corresponds to one of pins 60. In the illustrated embodiment, side rails 72 are connected to the lateral edges of PC board 70 and to carrier support 74, to maintain a selected spacing between PC board 70 and carrier support 74. The arrangement of PC board 70, carrier support 74 and side rails 72 is a matter of design choice that will depend on the configuration of the PC board and the connector being constructed. Epoxy dots 78 may be placed on carrier support 74 in order to secure carrier 64 to carrier support 74. The epoxy dots are not required if there is no substantial risk that carrier assembly 66 will move out of position during the assembly process.

Carrier assembly 66 may be installed on a substrate by hand, or it may be provided as a component for installation as part of a pick and place operation. Registration features (not shown) may be provided on the carrier and on the substrate to facilitate proper alignment, particularly if carrier assembly 66 is to be installed by hand. Such registration features may comprise projections that extend from the bottom of carrier 64 and corresponding holes in carrier support 74 designed to accept the projections when carrier support assembly 66 is properly aligned with substrate 68.

Figure 5:
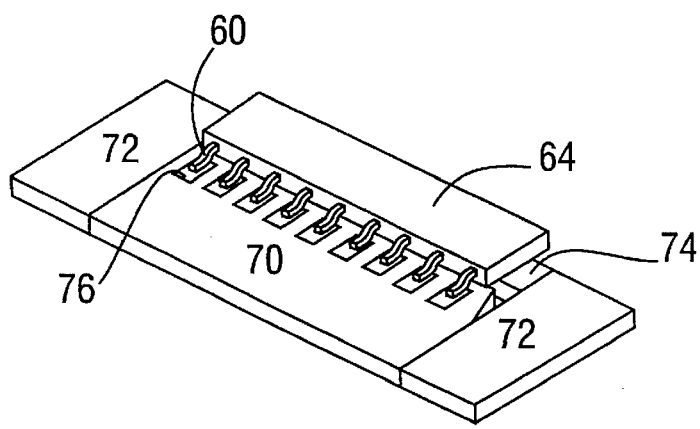
FIG. 5 shows a perspective view of the carrier assembly in its operative position on the substrate.
Figure 6:
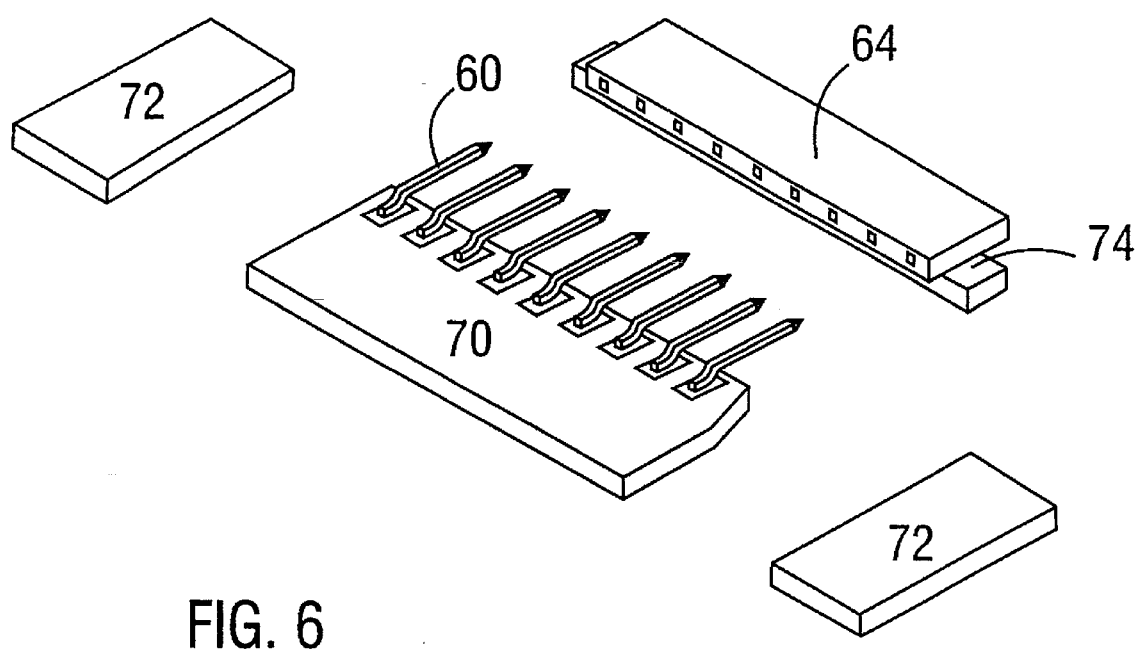
FIG. 6 shows the completed edge connector fastened to the printed circuit board after the side rails, carrier and carrier support have been removed.

FIG. 5 shows carrier assembly 66 and PC assembly 68 operatively connected by an epoxy joint between carrier 64 and carrier support 74. Note that each of pins 60 is aligned with one of connector pads 76. The assembly shown in FIG. 5 may be subjected to a fastening process, typically soldering, as is well known in the art for connecting components to pads on a printed circuit board, thereby securely connecting (mechanically and electrically) pins 60 to pads 76. After the soldering operation is completed, side rails 72 may be removed, as shown in FIG. 6, and the combination of carrier 64 and carrier support 74 may be slidable removed from pins 60, leaving pins 60 attached to PC board 70. Score lines or other frangible joining means may be provided between PC board 70 and side rails 72, as well as between carrier support 74 and side rails 72, allowing the side rails to be easily broken away. Pins 60 thus form an edge connector on PC board 70 which may be inserted into a socket or other structure on, e.g., another PC board. If desired, the method described above may be performed to attach a similar row of connector pins to the other side of the PC board as well. The embodiment shown in FIGS. 3–6 provides a row of pins 60 that are offset from the plane of the PC board 70. It will be apparent to those of skill in the art that a similar operation could be performed to provide a row of pins lying in the plane of the PC board, or even in a plane that is not parallel to the PC board, by suitable design of the PC assembly, the pin carrier, and the pins themselves.

Figure 7:
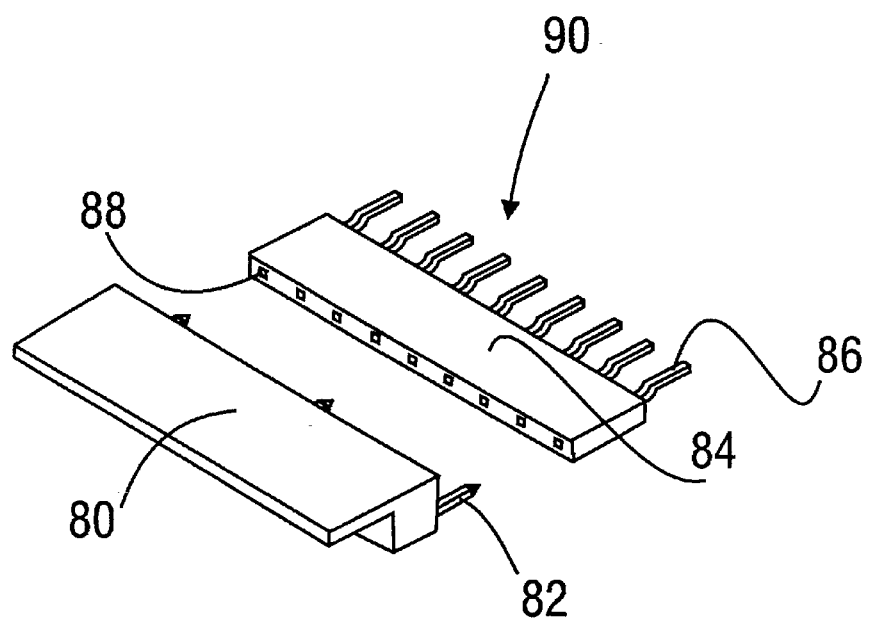
FIG. 7 shows a female connector and a corresponding carrier before they are coupled to form a carrier assembly.

In another embodiment of the present invention, shown in FIGS. 7–10, the present invention may be employed to attach an edge connector comprising an array of sockets to a PC board. The sockets may be aligned in the plane of the PC board, or they may be offset by a selected distance or angle. Referring to FIG. 7, the socket 84 that is to be attached to the PC board is equipped with pins 86 that are electrically connected to contacts inside holes 88. Carrier 80 may be coupled to socket 84 by inserting coupler pins 82 into one or more of socket holes 88, to form carrier assembly 90. Preferably, carrier 80 has at least two coupler pins 82 that may be inserted into socket holes 88 in order to provide a stable carrier assembly 90 for use in the manufacturing process.

Figure 8:
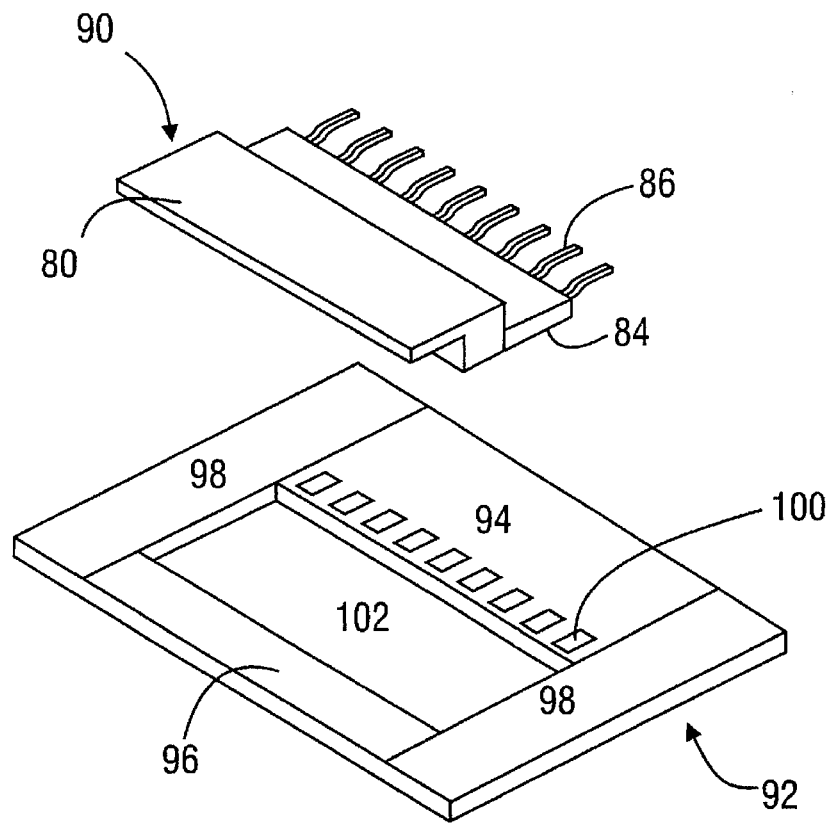
FIG. 8 shows a perspective view of a carrier assembly for use in attaching a female connector to a printed circuit board, and a substrate to which it is to be attached.
Figure 9:
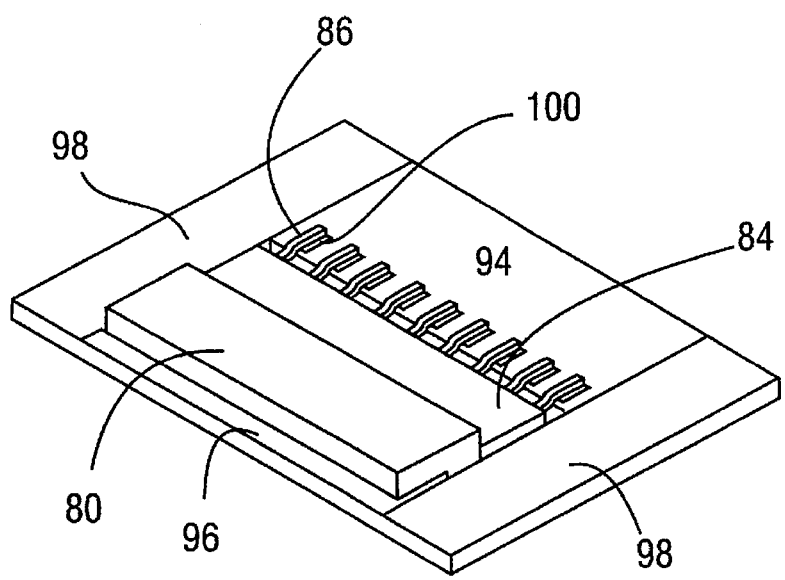
FIG. 9 shows a perspective view of a female connector carrier assembly operatively positioned on a substrate.

Referring to FIG. 8, PC board 94 includes a row of connector pads 100 adjacent one edge. Each of connector pads 100 corresponds to one of pins 86 on connector socket 84. PC board 94 is preferably fabricated as part of a PC assembly 92 that includes side rails 98 and carrier support 96. Each of side rails 98 is removably connected to PC board 94 and to carrier support 96. The configuration and dimensions of carrier 80 and PC assembly 92 are dependent upon the nature and size of PC board 94, carrier 80 and socket 84, and are selected as matters of design choice. As shown in FIGS. 8 and 9, the opening 102 in PC assembly 92 and the configuration of carrier 80 are designed to permit the carrier assembly 90 to nest within opening 102, with each pin 86 disposed adjacent the corresponding connector pad 100 on PC board 94. If desired, carrier 80 and carrier support 96 may be fastened together by methods well-known in the art that are often employed as part of a pick-and-place operation. If PC board 94 is not to be inverted at a subsequent stage of the manufacturing process, there is typically no need to fasten the carrier to the carrier support.

Figure 10:
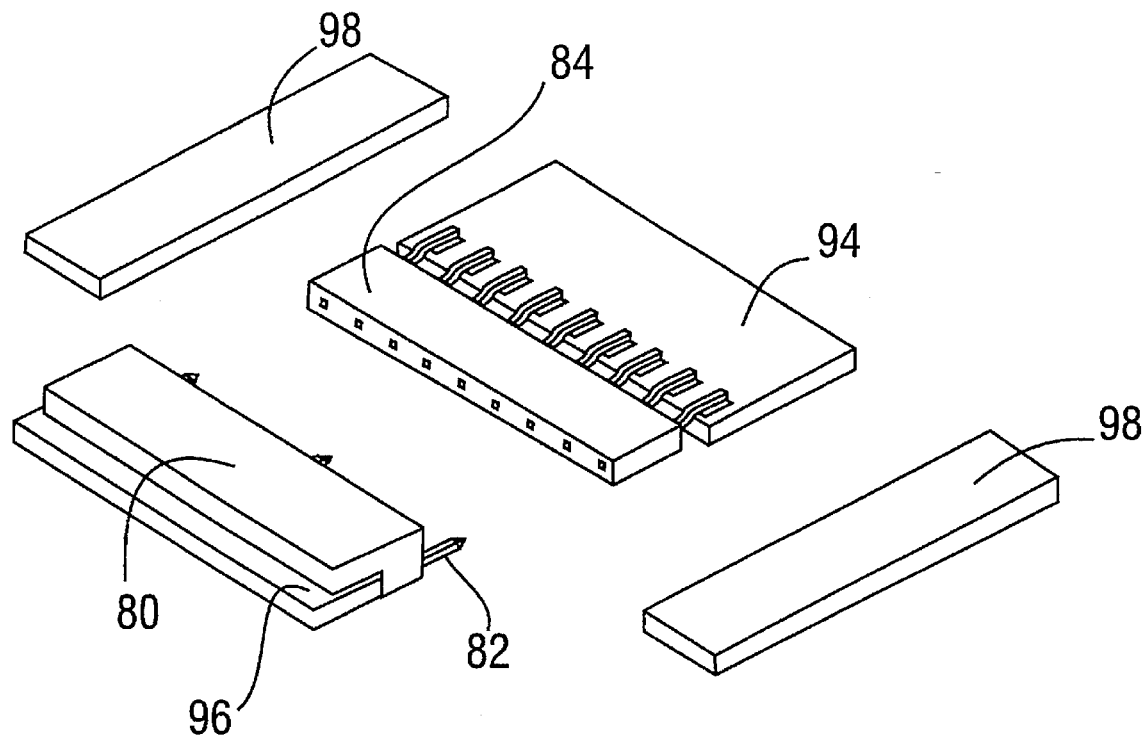
FIG. 10 shows the female connector coupled to the printed circuit board after the side rails, carrier and carrier support have been removed.

The assembly shown in FIG. 9 may be subjected to fastening techniques well known in the art to securely connect pins 86 to connector pads 100. Referring to FIG. 10, after fastening, e.g. by soldering, is completed, PC board 94 and attached socket 84 may be separated from the remaining components by removing side rails 98 and withdrawing carrier pins 82 from connector socket 84, leaving connector socket 84 properly connected to PC board 94. Of course, it will be apparent to a person skilled in the art that similar methods could be used to attach more than one connector to connector pads located on one or both sides of the PC board.

Figure 11:
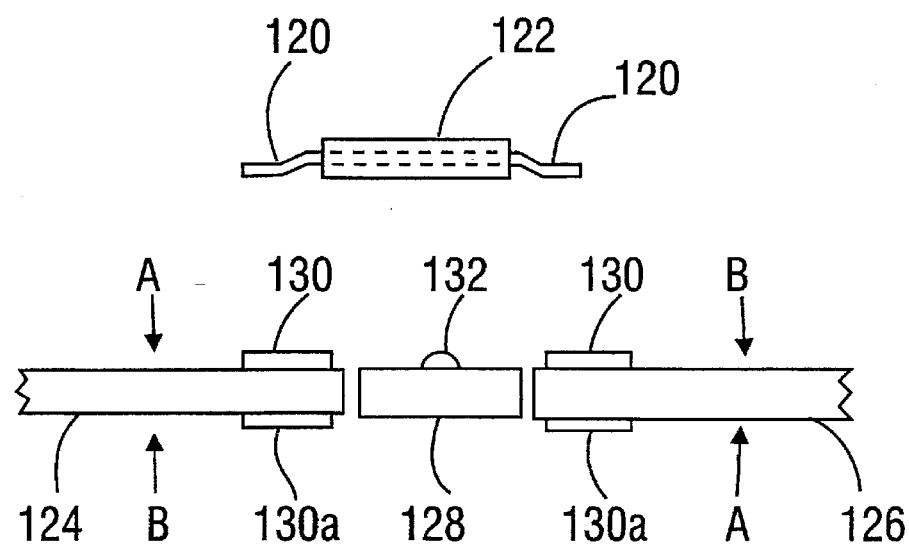
FIGS. 11–14 show a series of steps of a preferred embodiment of the invention wherein connector pins are attached to both sides of two printed circuit boards in one operation.

FIGS. 11–14 illustrate an exemplary method according to the present invention for attaching edge connector pins to both sides of a panelized PC board. Pins 120 are inserted into and carried by carrier 122. In the illustrated embodiment, PC assembly includes a first PC board 124, a second PC board 126, and carrier support 128. Each PC board 124, 126 has connector pads 130, 130a on its upper and lower surfaces, respectively. The PC boards 124, 126 and the carrier support may be held together by side rails, for example as shown in other embodiments illustrated in FIGS. 3–10. Referring to FIG. 11, glue dots 132 may be applied to carrier support 128 to hold carrier 122 in position when it is lowered to place pins 120 in contact with connector pads 130. Placement of glue dots 132 and carrier 122 (with pins 120 in place) may be incorporated into the "pick-and-place" process that is used to mount other components on PC boards 124, 126.

Figure 12:
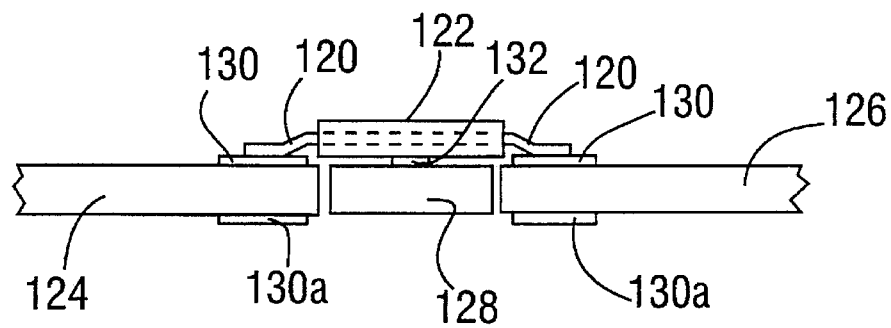
Figure 13:
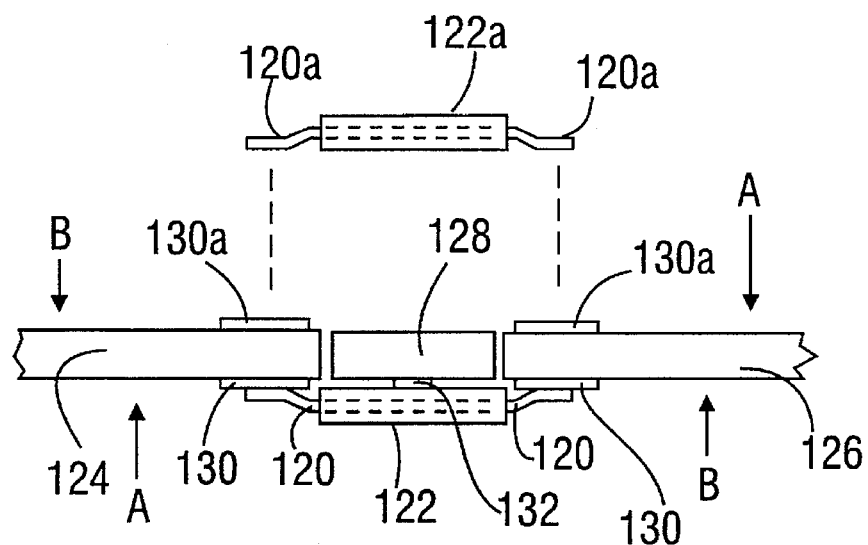
Figure 14:
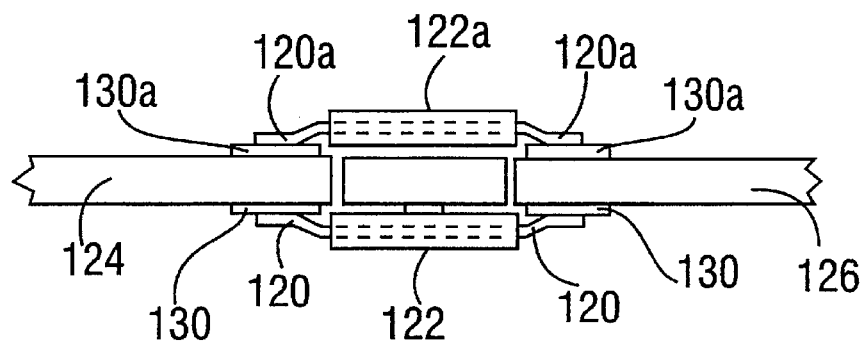

Referring to FIG. 12, after carrier 122 and pins 120 are securely fastened to carrier support 128 by glue 132, or other suitable means, the entire assembly may be inverted as shown in FIG. 13. Glue 132 holds carrier 122 in position when the assembly has been inverted as illustrated, so that carrier 122a and pins 120a which are inserted therein may be placed on what is now the top side of the assembly, such that pins 120a are disposed adjacent connector pads 130a. FIG. 14 shows the completed assembly with connector pins positioned on both sides of PC boards 124, 126 and prepared to enter a fastening operation, e.g., a soldering operation as is well known in the art.

In preferred embodiments, it is desirable to design PC boards 124, 126 such that pads 130 and 130a, which are on opposite sides of a single PC board, are not aligned with one another. In other words, pads 130 and 130a may be designed to alternate so as to form a "zig-zag" pattern, as is known in the art (e.g. as in a "ZIP" or "zig-zag in line pin" connection). This arrangement provides certain manufacturing advantages, which will be described further with reference to FIG. 11. Side A of PC board 124 is identical to side A of PC board 126. Similarly, side B of both boards is identical. Note that board 124 has side A in the up position whereas board 126 has side B facing upward. If pads 130, 130a are arranged in alternating fashion as described above, inverting one of the boards with respect to the other board, as shown in FIG. 11, causes the pads 130 on the top of board 124 to alternate with the pads 130 on the top of board 126. In order to align pins 120 with pads 130, the pins may be arranged in an alternating fashion in carrier 122 such that, for example, the tail of the first pin 120 is inserted into the left side of carrier 122, the tail of the second pin 120 is inserted into the right side of carrier 122, the tail of the third pin 120 is inserted into the left side of carrier 122, and so on. By alternating the pins rather than aligning them, carrier 122 may be made narrower and PC boards 124 and 126 may be fabricated closer together. The same arrangement is used on the other side of the PC board assembly, thus allowing an identical operation to be performed on both sides of the PC board assembly (the combination of boards 124 and 126, along with carrier support 128 and side rails that are not shown). The board assembly may be loaded by performing the same pick-and-place operation twice, once on each side of the board assembly. This alternating arrangement provides a "zig-zag in-line pin" connector, which is a connector configuration well known in the art.

Figure 19:
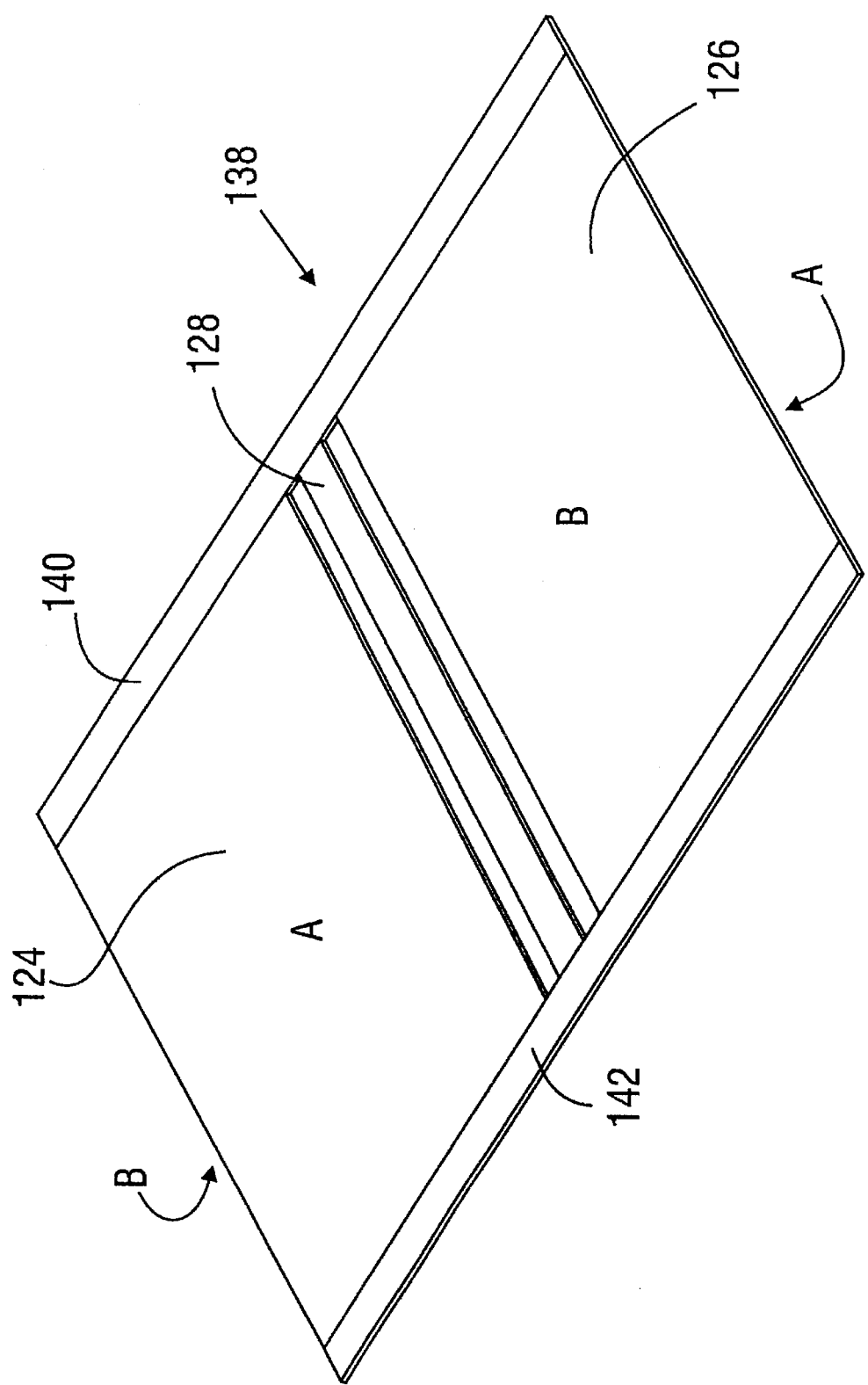
FIG. 19 is a perspective view of a pair of symmetrically panelized printed circuit boards.

FIG. 19 shows a pair of symmetrically panelized printed circuit boards 124, 126 that are separably connected by frangible side rails 140, 142 to form panel 138. According to one aspect of this invention, as was discussed to some extent above, printed circuit boards may be panelized in a symmetric fashion so that both sides of panel 138 are identical, even though each printed circuit board has two different sides, indicated as side A and side B. This may be done by constructing panel 138 with a first printed circuit board 124 having side A facing upward and a second printed circuit board having side B facing upward. Carrier support 128 may be included in such a panel if edge connectors are to be attached to the printed circuit boards according to the invention described herein.

Substantial manufacturing advantages may be realized because this arrangement provides a panel 138 with two identical sides. Only one set-up is required to populate both sides of the panel with components, including connectors as described in this specification. Only one solder stencil is required, and only one pick-and-place program is required. After the first side of the panel is loaded with components it may be merely turned over and processed in an identical fashion to populate the second side. After processing is complete, the side rails 140, 142 may be broken off to separate the printed circuit board.

It will be apparent to those of skill in the art that any desired number of printed circuit boards may be panelized into a symmetrical panel having identical sides in accordance with the above description. For example, a plurality of small memory boards may be arranged side-by-side in a linear array to form a panel. In such an array a number of different symmetrical arrangements of printed circuit boards may be employed. For example, the orientation of each memory board may differ from that of each of its neighbors (A-B-A-B), or all of the "A side up" boards may be placed at one end of the panel and all of the "B side up" boards may be placed at the other end of the panel (A-A-B-B).

Referring to FIG. 20, a shrouded connector assembly 220 may be assembled by first mounting a plurality of connector contacts 206 to contact pads 202 on PC board 200, and then installing shroud 216 over the installed connector pins. The contacts 206 may be male contacts or female contacts, and they may be affixed to the PC board by any of the methods disclosed in this patent or by other methods known in the art. FIG. 20 shows yet another embodiment of the present invention, wherein the contacts 206 are integrally formed with pins 204 that are adapted to be connected to contact pads 202 on PC board 200. The contacts 206 are supported by carrier 208, which may be integrally formed with contacts 206, or which may be adapted to engage and retain contacts 206 in the desired relative positions. The combination of carrier 208 and contacts 206 (including pins 204) will be referred to as contact assembly 203.

Figure 20A:
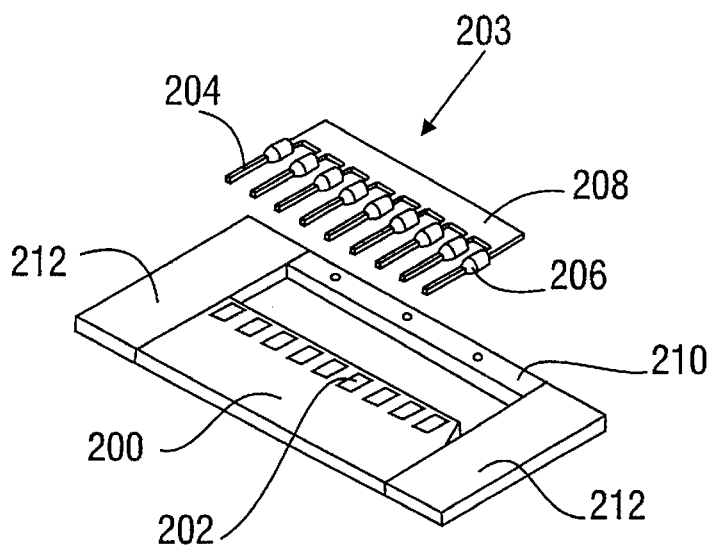
FIG. 20 (a–g) illustrates the steps of an embodiment of the invention wherein pins are installed on a PC board and a shroud is then positioned over the pins.
Figure 20B:
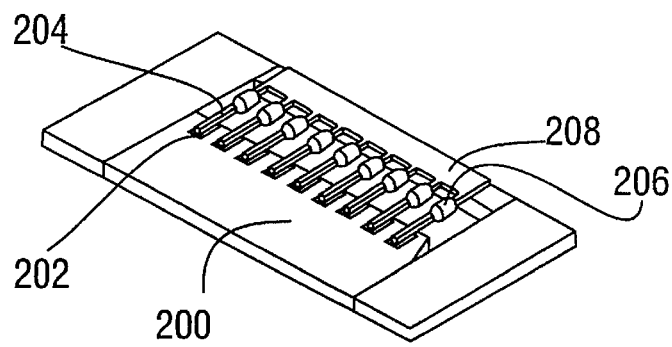
Figure 20C:
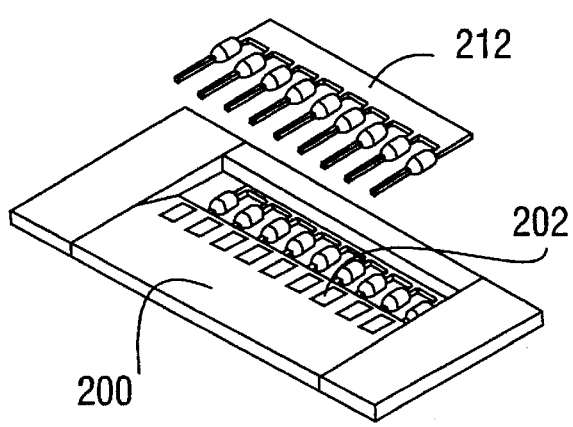
Figure 20D:
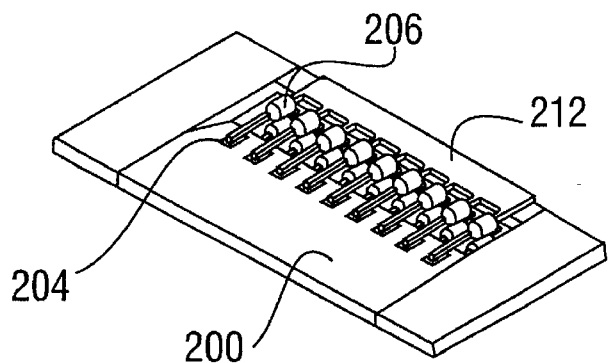

Referring to FIG. 20(b), contact assembly 203 may be positioned, as by a pick-and-place machine, onto carrier support 210, as is discussed elsewhere in this patent. FIG. 20(c) shows that a second contact assembly 212 may be positioned on the opposite side of the PC board 200, as by a pick-and-place operation (see FIG. 20(d)). After the contact assemblies 203, 212 are in position (along with other components to be mounted on PC board 200), the PC board 200 and other components may be reflowed to conductively connect the components to one another with solder, as is well known in the art.

Figure 20E:
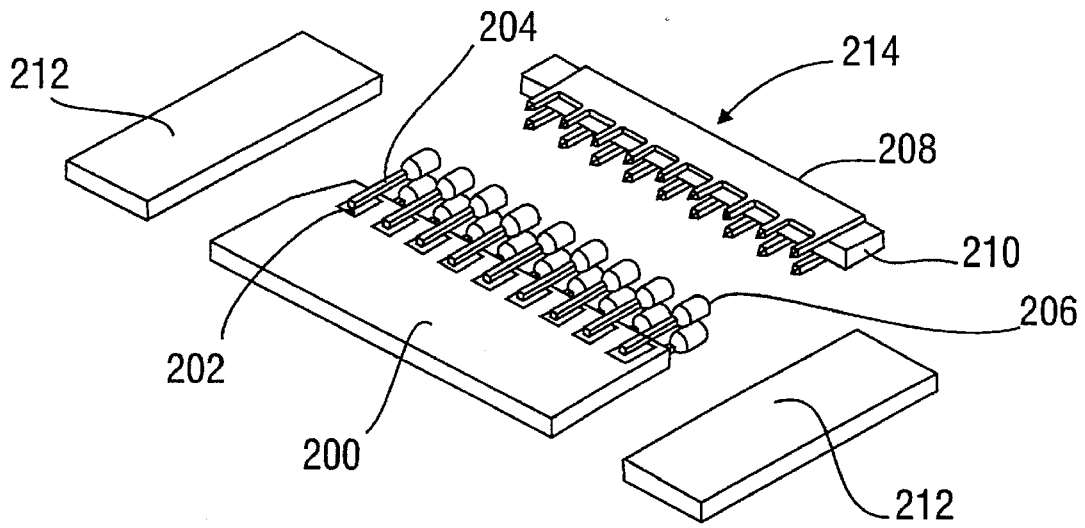

Referring to FIG. 20(e), after the contact pins 204 have been soldered to pads 202 on PC board 200, side rails 212 and carrier support 210 may be broken apart to separate carriers 208 from contacts 206. The result of that operation is a PC board 200 having contacts 206 securely and conductively attached thereto. At that point the assembly may be inspected and tested to ensure that all pins are properly connected, and pins or connections may be repaired as necessary.

Figure 20F:
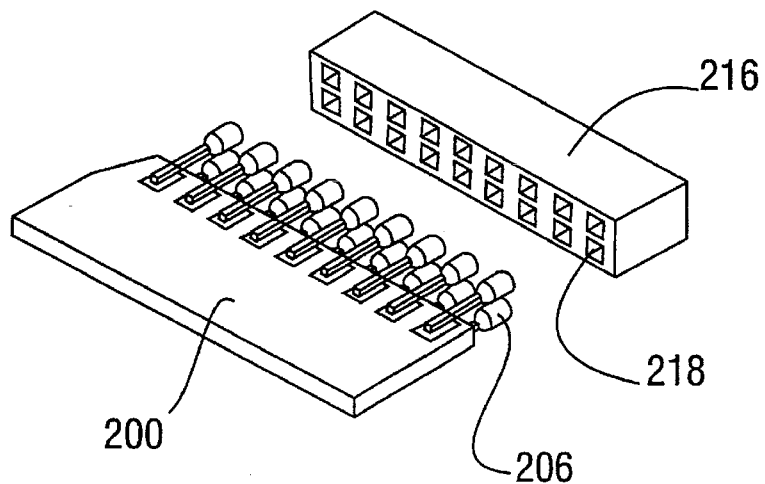
Figure 20G:
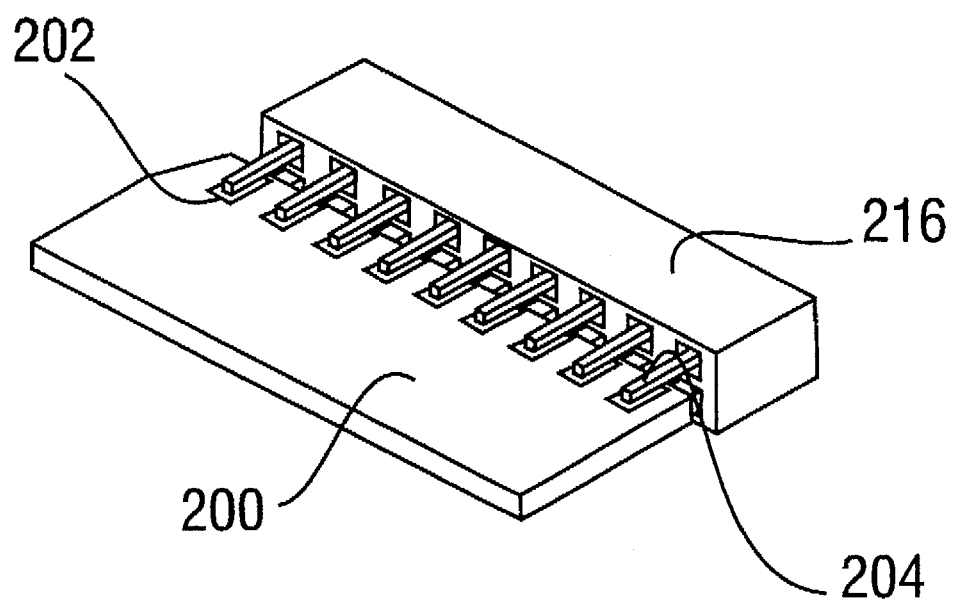

Finally, as shown in FIGS. 20(f) and 20(g), a shroud 216 may be fitted over the contacts 206 to protect and support the contacts 206. The shroud 216 will typically be fabricated from plastic having an orifice or channel 218 corresponding to each contact 206. Shroud 216 may include latching structures for preventing or inhibiting its removal after it has been installed over the contacts 206. The latching structures may be integrally molded with the shroud, or they may comprise metallic or other inserts. Alternatively, the shroud may be made of metal, ceramic or other materials known in the art. The shroud may contain conductive elements that form part of the electrical connector, or it may merely enclose the pins and contacts, which make up the conductive portion of the connector.

The technique shown in FIG. 20 permits a shrouded connector to be installed on a PC board, such as a PCMCIA board, with the conductive connector elements installed in the same pick-and-place and soldering operation as other board components. Installation of the shroud is then a simple manual or automated operation that does not involve making effective electrical connections. One benefit of this invention is that it permits the connector contacts to be inspected and repaired before the shroud is installed. Any of the embodiments disclosed herein, as well as other methods known in the art, may be employed to mount the contact pins on the PC board before the shroud is installed.

Further modifications and alternative embodiments of this invention will be apparent to those skilled in the art in view of this description. Accordingly, this description is to be construed as illustrative only and is for the purpose of teaching those skilled in the art the manner of carrying out the invention. It is to be understood that the forms of the invention herein shown and described are to be taken as the presently preferred embodiments. Various changes may be made in the shape, size, and arrangement of parts. For example, equivalent elements or materials may be substituted for those illustrated and described herein, and certain features of the invention may be utilized independently of the use of other features, all as would be apparent to one skilled in the art after having the benefit of this description of the invention.

What is claimed is:

1. A method of forming an edge connector on a substrate, the substrate having a first side and a second side and having at least one connector pad disposed proximate an edge, comprising:

coupling at least one connector pin to a carrier, each pin having a head end and a tail end;

placing the carrier adjacent the substrate with the head end of the at least one pin positioned adjacent the at least one connector pad;

fastening the head end of the at least one connector pin to the at least one connector pad;

removing the carrier so as to expose the tail end of the at least one connector pin; and installing a shroud over the at least one connector pin.

2. The method of claim 1, wherein the coupling step comprises removably inserting a plurality of individual connector pins into cavities formed in the carrier.

3. The method of claim 1, wherein the placing step includes providing a carrier support portion of the substrate that is removably attached to an operative portion of the substrate that includes the connector pads, and attaching the carrier to the carrier support portion; and wherein the removing step includes separating the carrier support portion of the substrate with the carrier attached thereto from the operative portion of the substrate.

4. The method of claim 3, further comprising adhering the carrier to the carrier support portion.

5. The method of claim 1, wherein the placing step comprises selecting a carrier coupled to a plurality of pins from a supply of such carriers and placing the selected carrier on a preselected substrate with a pick-and-place machine.

6. The method of claim 1, further comprising performing the coupling, placing, fastening and removing steps on the second side of the substrate.

7. A method of attaching an edge connector to a substrate, the substrate having a plurality of connector pads disposed proximate an edge thereof, comprising:

providing a carrier assembly including an edge connector removably coupled to a carrier, the edge connector having a plurality of connector pins extending therefrom;

placing the carrier assembly adjacent the substrate with the pins adjacent the connector pads;

fastening the connector pins to the connector pads;

removing the carrier from the edge connector, leaving the edge connector coupled to the substrate; and installing a shroud over the connector pins.

8. The method of claim 7, wherein the edge connector is a female-type connector and the carrier comprises a plurality of carrier pins, and further comprising forming the carrier assembly by inserting the carrier pins into cavities in the female-type connector.

9. The method of claim 7, wherein the placing step comprises selecting a carrier assembly from a supply of carrier assemblies and placing the selected carrier on a preselected substrate with a pick-and-place machine.

10. The method of claim 7, wherein the placing step includes providing a carrier support portion of the substrate that is removably attached to an operative portion of the substrate that includes the connector pads, and attaching the carrier to the carrier support portion; and wherein the removing step includes separating the carrier support portion of the substrate with the carrier attached thereto from the operative portion of the substrate and from the connector.

11. The method of claim 10, wherein the operative portion and the carrier support portion of the substrate are connected to one another by removable side rails.

12. The method of claim 11, comprising forming the operative portion, the carrier support portion and the side rails as an integral unit, and comprising forming frangible joints between the side rails and the other portions of the substrate.

13. A method for installing a shrouded connector to a PC board having a plurality of connector pads proximate an edge thereof, comprising:

first, attaching a plurality of electrical contacts to the plurality of connector pads; and second, fitting a shroud over the plurality of electrical contacts to form a shrouded connector.

14. The method of claim 13, wherein the attaching step comprises providing said electrical contacts coupled to a carrier forming a carrier assembly, and positioning the carrier assembly proximate the PC board using a pick-and-place machine.

15. The method of claim 13, wherein the attaching step comprises attaching a first set of electrical contacts to a first side of the PC board, and attaching a second set of electrical contacts to a second side of the PC board; and wherein the shroud engages the first set of electrical contacts and the second set of electrical contacts.

16. The method of claim 13, wherein the PC board is a PCMCIA card.

17. A PCMCIA card manufactured using the method of claim 13.

18. The method of claim 13, further comprising inspecting the attachment of the electrical contacts after the attachment step and before the fitting step.

* * * * *